United States Patent [19]
Pelley, III et al.

[11] Patent Number: 4,710,902
[45] Date of Patent: Dec. 1, 1987

[54] TECHNIQUE RESTORE FOR A DYNAMIC RANDOM ACCESS MEMORY

[75] Inventors: Perry H. Pelley, III, Austin; Bruce L. Morton, Round Rock, both of Tex.

[73] Assignee: Motorola, Inc., Schaumburg, Ill.

[21] Appl. No.: 784,449

[22] Filed: Oct. 4, 1985

[51] Int. Cl.[4] .......................... G11C 7/00; G11C 11/24; G11C 11/34
[52] U.S. Cl. ...................................... 365/222; 365/194
[58] Field of Search ............... 365/222, 149, 150, 194, 365/207

[56] References Cited

U.S. PATENT DOCUMENTS

| | | | |
|---|---|---|---|
| 4,293,932 | 10/1981 | McAdams | 365/222 |
| 4,334,293 | 6/1982 | Ponder | 365/222 X |
| 4,376,988 | 3/1983 | Ludwig et al. | 365/222 |
| 4,475,178 | 10/1984 | Kinoshita | 365/203 |
| 4,477,886 | 10/1984 | Ay | 365/203 X |
| 4,543,501 | 9/1985 | McAlexander, III et al. | 365/203 X |
| 4,581,718 | 4/1986 | Oishi | 365/189 |
| 4,581,720 | 4/1986 | Takemae et al. | 365/222 |

Primary Examiner—Stuart N. Hecker
Assistant Examiner—Alyssa H. Bowler
Attorney, Agent, or Firm—John A. Fisher; Jeffrey Van Myers; James L. Clingan, Jr.

[57] ABSTRACT

Memory cells in a dynamic random access memory are coupled to bit lines which are coupled to sense amplifiers. Memory cells are enabled by an enabled word line which causes the memory cells to output data onto the bit lines to which they are coupled. A selected bit line is coupled to a data line while the sense amplifier is amplifying the signal provided by the memory cell. The effect of coupling the bit line to the data line is to hinder the refresh of the selected memory cell because the bit line does not reach full power supply voltage due to the loading by the data line. Full refresh is obtained by keeping the word line enabled for a predetermined time following the bit line being decoupled from the data line so the sense amplifier can bring the bit line to full power supply potential.

13 Claims, 3 Drawing Figures

TECHNIQUE RESTORE FOR A DYNAMIC RANDOM ACCESS MEMORY

CROSS-REFERENCE TO RELATED APPLICATIONS

Related subject matter is disclosed in U.S. application Ser. No. 784,450 entitled "Data Line Precharge," filed simultaneously herewith and assigned to the assignee hereof.

FIELD OF THE INVENTION

The present invention relates to dynamic random access memories, and more particularly to a system for restoring data in the memory cells of a dynamic random access memory.

BACKGROUND OF THE INVENTION

In dynamic random access memories (DRAMs), the memory cells need to be periodically restored (also referred to as refreshed). This is achieved as part of the sensing operation. A DRAM typically has a multiplexed address. The row address occurs first and selects a word line which is to be enabled. Each memory cell coupled to the enabled word line outputs data contained in the memory cell onto a bit line to which it is coupled which in turn is coupled to a sense amplifier. There are actually two bit lines coupled to each sense amplifier. One bit line is coupled to an enabled memory cell. The other bit line is used as a reference. This bit line used a reference has often had a reference or dummy cell connected to it. Another technique has left the reference bit line floating. In either case a voltage differential is developed between the bit line with the enabled cell and the reference bit line which is amplified by a sense amplifier. The sense amplifier increases the voltage separation of the two bit lines. The sense amplifier actually provides the refresh of the enabled memory cell. For the memory cell to be refreshed, the word line must be enabled and the bit line which is coupled to the enabled memory cell should be at as near the power supply as possible, i.e., 5 volts or ground, depending on the logic state which is to be restored.

The time required for the bit lines to become fully separated is longer than that required just for determining the logic state stored by the memory cell. Additionally, the selected bit line is not brought to full power supply voltage while the column decoder is coupling it to a secondary amplifier. Consequently, a full restore may not occur for the memory cell which was selected to be read. To reduce the loading on a selected bit line, the conductivity of the column decoder coupling transistors which coupled the bit lines to the secondary amplifier was decreased. This had the beneficial effect of allowing the sense amplifier to more nearly bring the bit line with the selected memory cell to the power supply voltage. There was, however, a disadvantage. The increased resistance of the column decoder couplng transistors reduced the speed with which a read or a write could be accomplished. Consequently, a tradeoff between speed and restore had to be made.

SUMMARY OF THE INVENTION

An object of the present invention is to provide an improved restore technique for a dynamic random access memory.

Another object of the invention is to provide a DRAM with an improved active cycle.

Yet another object of the invention is to provide an improved restore timing scheme for a DRAM.

These and other objects are achieved in a A dynamic random access memory which has a plurality of bit lines, a plurality of word lines intersecting the plurality of bit lines, a plurality of refreshable memory cells located at respective intersections of the bit lines and the word lines, a row decoder circuit, a plurality of sense amplifiers coupled to respective bit lines, a column decoder circuit, a secondary sense amplifier coupled to the common data line, and a clock circuit. Each memory cell provides a signal to its respective bit line indicative of data stored therein in response to its respective word line being enabled. The row decoder circuit enables a selected word line in response to receiving a row address and disables all of the word lines in response to receiving a row disable signal. Each sense amplifier amplifies the signal on the respective bit line provided by the memory cell coupled to the respective bit line and the enabled word line. The column decoder circuit couples a selected bit line to a common data line in response to receiving a column address and decouples the selected bit line from the common data line in response to a clock signal. The secondary sense amplifier amplifies the signal coupled to the common data line from the selected bit line. The clock circuit generates, in response to the clock signal, the row disable signal a predetermined time duration after the column decoder means has decoupled the selected bit line from the common data line.

DESCRIPTION OF THE INVENTION

Figure 1:
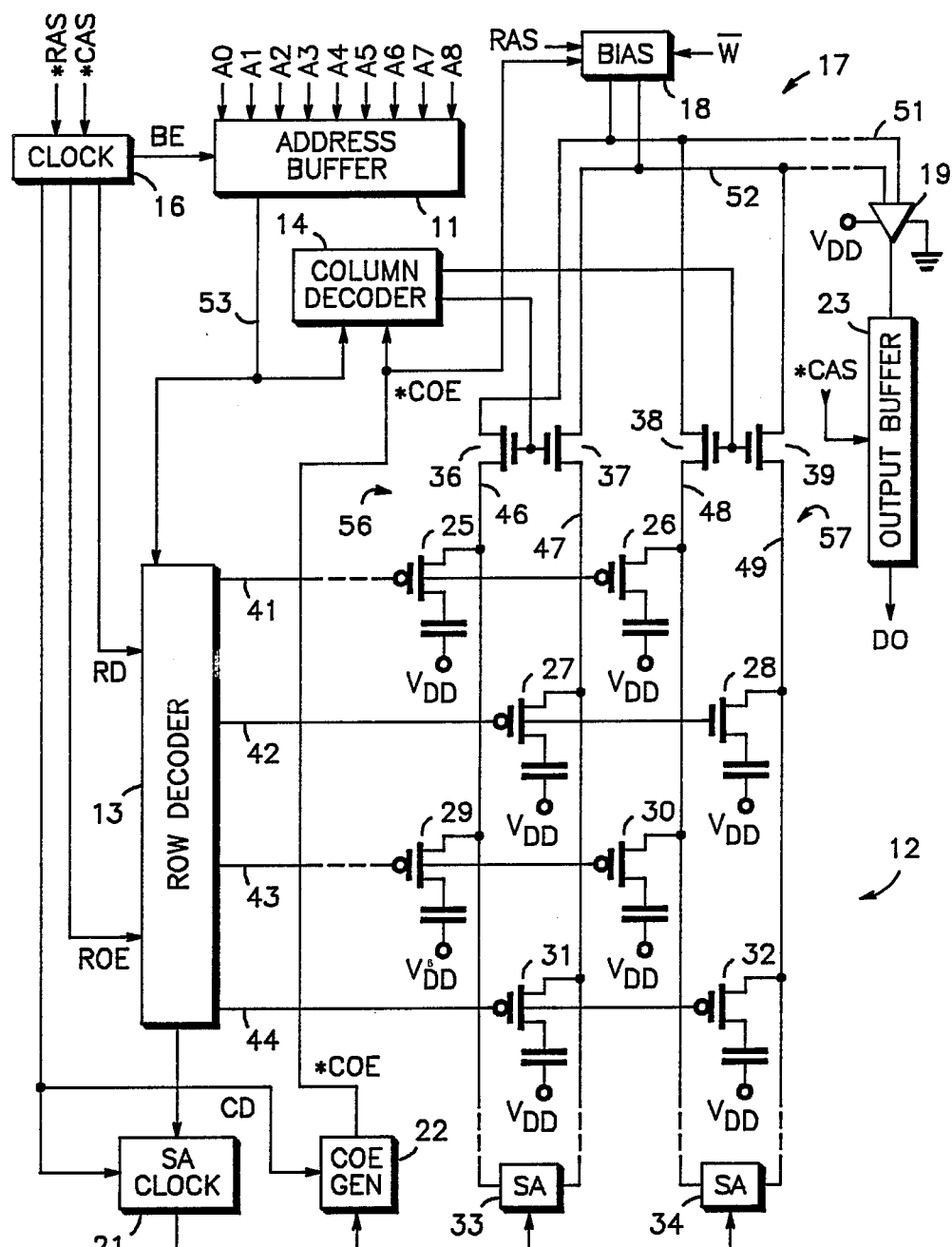
FIG. 1 is a combination of a block diagram and circuit diagram of a memory according to a preferred embodiment of the invention.

Shown in FIG. 1 is a memory 10 comprised generally of an address buffer circuit 11, an array 12, a row decoded 13, a column decoder 14, a clock circuit 16, a data line pair 17, a data line bias circuit 18, a secondary amplifier 19, a sense amplifier clock circuit 21, a column enable generator 22, and an output buffer 23. Array 12 is comprised of a plurality of intersecting word lines and bit lines with a dynamic random access memory cell at each intersection of a bit line and word line and a sense amplifier for each pair of bit lines. Shown in FIG. 1, array 12 is comprised of memory cells 25, 26, 27, 28, 29, 30, 31, and 32; sense amplifiers 33 and 34; coupling transistors 36, 37, 38, and 39; and word lines 41, 42, 43, and 44; and bit lines 46, 47, 48, and 49. Data line pair 17 is comprised of data lines 51 and 52. Memory array cells 25–32 are P channel transistors with a storage capacitor. Such use of P channel transistors has not been as common as using N channel transistors but is nonetheless well known in the art. Each memory cell 25–32 has a control input, a data input/output (I/O), and a reference terminal. The reference terminal of all memory cells 25–32 is connected to VDD, a positive power supply terminal for receiving a 5 volt power supply voltage.

Address buffer circuit 11 receives address signals A0, A1, A2, A3, A4, A5, A6, A7, and A8. Clock 16 receives a row address strobe signal *RAS. An asterisk (*) is used to indicate that the signal is active when it is a logic low. Address signals A0–A8 are multiplexed as first 9 row address signals then 9 column address signals. This provides for addressing 262,144 memory locations. This is conventional for what is commonly known as a 256K DRAM. Address signals A0–A8 are multiplexed onto an address bus 53 which is coupled to row decoder 13 and column decoder 14. Address buffer circuit 11 provides the row address and the column address onto bus 48 in response to address signals A0–A9. In a typical NMOS DRAM the row address is clocked by *RAS and the column address is clocked by a column address strobe signal *CAS. In CMOS DRAMs, however, it has been shown that there are advantages to timing both the column address and row address from only signal *RAS. Memory 10 is a CMOS DRAM in which most of the control circuitry such as circuit 11, circuit 16, decoders 13 and 14, circuit 18, amplifier 19, and buffer 23 are CMOS. Upon signal *RAS switching from an inactive state to an active state, clock circuit 16 generates a buffer enable signal BE. In response to signal BE, the address signals A0–A8 which are present as inputs to circuit 11 are latched into buffer 11 and coupled onto bus 53 as row address signals. Signal BE is active for about 4 nanoseconds (ns). Address buffer 11 provides the latched address onto bus 53 while signal BE is inactive. Circuit 16 also provides a row enable signal ROE in the active state to row decoder 13 in response to signal *RAS being active. The presence of signal ROE in the active state causes row decoder 13 to respond to the row address present on bus 53. Signal ROE is active for a relatively short time, approximately 4 ns but sufficiently long for row decoder 13 to latch the row address received on bus 53. After signal ROE becomes inactive, row decoder 13 no longer responds to signals present on bus 53. Signal ROE is timed to become active only after the address received by row decoder 13 is the row address which has been latched by buffer 11.

Signal BE is switched again to the active state a predetermined time delay after signal BE had previously switched to the inactive state. This second time that signal BE switches to the active state after signal *RAS has become active causes address signals A0–A8 received by buffer 11 to be coupled onto bus 53 as the column address. Column decoder 14 is responsive to the column address on bus 53 after column decoder 14 has received a column enable signal *COE. Signal *COE is received by column decoder 14 from column enable generator 22. Generator 22 provides signal *COE in response to sense amplifier clock 21 which also enables sense amplifiers 33 and 34.

Row decoder 13, in response to receiving and latching the row address received from bus 53, enables a selected one of word lines 41–44. Only 4 word lines are shown for clarity of description. It is of course well known that a 256K DRAM has many more word lines, bit lines, and sense amplifiers than those shown. The enabled word line is latched in the enabled state. After the selected word line has been enabled, row decoder 13 causes clock 21, which is connected to row decoder 13, to enable sense amplifiers 33 and 34 as well as causing generator 22 to activate signal *COE. The activation of signal *COE is timed to activate column decoder 14 after sense amplifiers 33 and 34 have developed signals on the bit lines to which they are coupled. Sense amplifier 33 is coupled to bit lines 46 and 47. Sense amplifier 34 is coupled to bit lines 48 and 49. Memory cells 25 and 26 have their control inputs connected to word line 41. Memory cells 27 and 28 have their control inputs connected to word line 42. Memory cells 29 and 30 have their control inputs connected to word line 43. Memory cells 31 and 32 have their control inputs connected to word line 44. Memory cells 25 and 29 have their data I/O's connected to bit line 46. Memory cells 27 and 31 have their data I/O's connected to bit line 47. Memory cells 26 and 30 have their data I/O's connected to bit line 48. Memory cells 28 and 32 have their data I/O's connected to bit line 49.

Assuming that the row address has selected word line 42, word line 42 is enabled by row decoder switching it from a logic high to a logic low. This causes memory cells 27 and 28 to output data onto bit lines 47 and 49, respectively. No memory cells along bit lines 46 and 48 are enabled. Bit lines 46 and 47 comprise a bit line pair 56, and bit lines 48 and 49 comprise a bit line pair 57. Sense amplifiers 33 and 34 are connected to bit line pairs 56 and 57, respectively. Prior to word line 42 being enabled, bit line pairs 56 and 57 are equalized by sense amplifiers 33 and 34 to approximately ½ VDD. The equalization of the bit lines by the sense amplifiers is achieved under the control of clock 21 in response to active signal *COE being received by clock 21. After word line 42 is enabled, clock 21 enables sense amplifiers 33 and 34 so that sense amplifiers 33 and 34 begin amplifying the voltage differential caused by memory cells 27 and 28 outputting data onto bit lines 47 and 49, respectively. Very soon after sense amplifiers 33 and 34 have begun amplifying the differential on bit line pairs 56 and 57, a bit line pair, selected by column decoder 14, is coupled to data line pair 17.

Column decoder 14 has a plurality of outputs. One of these outputs is selected to be active by the column address. Only a first and a second output are shown in FIG. 1. Coupling transistors 36 and 37 have a control gate connected to the first output of column decoder 14. Coupling transistors 38 and 39 each have a gate connected to the second output of column decoder. Transistor 36 has first current electrode connected to line 51 and a second current electrode connected to bit line 46. Transistor 37 has first current electrode connected to data line 52 and a second current electrode connected to bit line 47. Transistor 38 has first current electrode connected to data line 51 and a second current electrode connected to bit line 48. Transistor 39 has first current electrode connected to data line 52 and a second current electrode connected to bit line 49. Transistors 36–39 are N channel transistors. Bit line pair 56 is coupled to data line pair 17 via transistors 36 and 37. The first output of decoder 14 is selected to become active at a logic high by the column address. The logic high is not provided by decoder 14 until signal *COE becomes active. Signal *COE provides the control so that a bit line pair is not coupled to data line pair 17 until after the sense amplifiers have begun amplifying the voltage differential on the bit line pairs.

Figure 2:
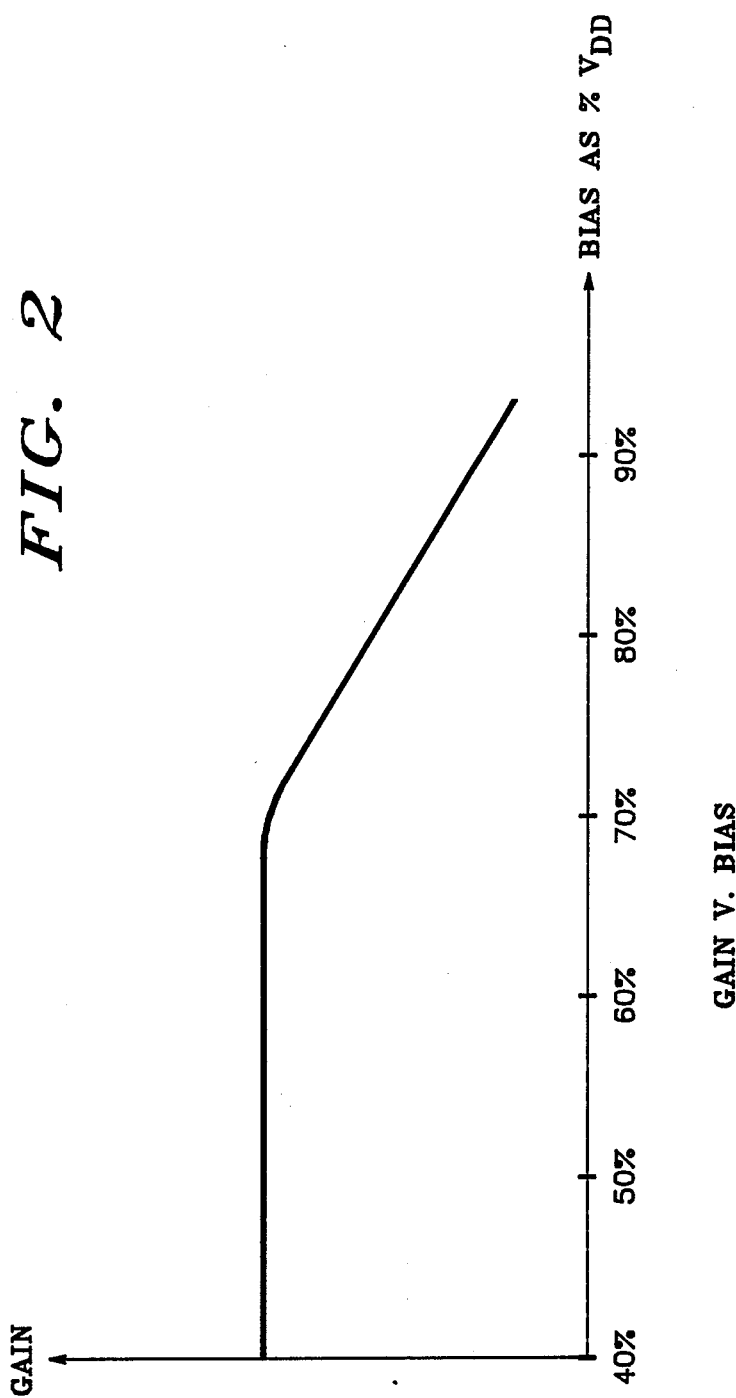
FIG. 2 is a gain plot of a conventional CMOS secondary amplifier.

Data lines 51 and 52 have been precharged to a voltage approximately equal to the voltage at which the bit lines are equalized prior to a word line being enabled. This is approximately ½ VDD but a few tenths of a volt greater than ½ VDD. This bias of data lines 51 and 52 is achieved by bias circuit 18 which has a first output connected to data line 51, a second output connected to data line 52, a first power supply receiving terminal connected to VDD, and a second power supply receiving terminal connected to ground. Biasing data lines 51 and 52 at approximately ½ VDD has the benefit of biasing amplifier 19 in its optimum gain region. A plot of gain versus bias voltage for a conventional CMOS differential amplifier such as amplifier 19 is shown in FIG. 2. The gain begins to noticeably decrease when the bias voltage reaches about 70% of the power supply voltage. Consequently, the bas voltage is desirably at some intermediate voltage not in excess of 70% of the power supply voltage. Bias circuit 18 begins establishing the desired bias voltage on data line pair 17 in response to *RAS becoming active. A first portion of bias circuit 18 is controlled by signal *COE, and a second portion by a write signal *W. The second portion of bias circuit 18, which is controlled by signal *W is active when signal *W is inactive which is when memory 10 is in a read mode. Application of the first portion of the bias is terminated by bias circuit 18 in response to receiving active signal *COE. Bias circuit 18 is thus no longer applying the full bias when a bit line pair is coupled to data line pair 17 because the column decoder is not activated until signal *COE is active. When signal *COE becomes active, a bit line pair is selected which in effect is the selection of a sense amplifier to be coupled to data line pair 17. The second portion of bias circuit 18 remains active when the selected sense amplifier is coupled to data line pair 17 to offset the bias that the sense amplifier would establish if no bias were otherwise applied to the data line pair. This keeps data line pair 17 biased in the high gain region of secondary amplifier 19.

With amplifier 19 operating in its optimum gain state due to the bias on data lines 17, the voltage differential developed on the data lines 51 and 52 is amplified more by amplifier 19 than in the prior art in which the data lines were biased near or at the power supply voltage. This results in faster resolution of the data represented by the voltage differential coupled onto data line pair 17. Amplifier 19 has an output which is the amplification of the differential input provided by data lines 51 and 52. Output buffer 23 has an input connected to the output of amplifier 19, and an output for providing output data signal DO as an output of memory 10. Output buffer 23 has threshold at which it can reliably output the data signal DO as required. This threshold of output buffer DO is reached more quickly due to the increased functional gain of 19 which in turn is due to biasing the data lines at the intermediate voltage.

Output buffer 23 clocks the data provided on its input as signal DO in response to signal *CAS being active. Because the data is ready sooner, the specification for the time between signal *RAS becoming active and signal DO being valid is reduced.

For the example described in which bit line pair 56 is coupled to data line pair 17, bit lines 46 and 47 do not reach full voltage separation which is required for optimum restore of the accessed memory cell, memory cell 27. One bit line should be at ground and the other should be at VDD for optimum restore. If memory cell 27 was storing a logic high, then bit line 47 should be at VDD for optimum restore. Conversely, if memory cell 27 was storing a logic low, then bit line 47 should be at ground for optimum restore. Bit lines 46 and 47 are not fully separated because they are coupled to data line pair 17. All of the bit line pairs which are not accessed are fully separated so that the accessed cells on the unselected bit lines are fully refreshed. In the past both the column decoder and the row decoder were disabled at the same time. Disabling the column decoder decoupled the selected bit lines from the data lines. Disabling the row decoder disabled all of the word lines including the selected word line. Once the selected word line is disabled, the restore of the memory cells along that word line is completed.

In order to achieve optimum restore, column decoder 14 is disabled before row decoder 13 is disabled. The previously selected bit lines, bit lines 46 and 47 of the described example, are then fully separated while the selected word line, word line 42, is enabled. With word line 42 enabled, selected memory cell 27 can still be restored. Column decoder 14 is disabled in response to signal *RAS becoming inactive. Row decoder 13, however, is not disabled until a predetermined time delay following signal *RAS becoming inactive. Row decoder 13 is disabled in response to a row decoder disable signal RD, received from clock 16, becoming active. Signal RD becomes active about 15 ns after *RAS has switched to the inactive state. This has the effect of keeping the selected word line enabled for about 15 ns after the selected bit line pair, bit line pair 56, has been decoupled from the data line pair, data line pair 17. With bit line pair 56 decoupled from data line 17, sense amplifier 33 completes the separation of bit lines 46 and 47. Within the 15 ns that word line 42 is enabled after bit line pair 56 is decoupled from data line pair 17, one of bit lines 46 and 47 is brought to VDD, and the other is brought to ground. The optimum restore of memory cell 27 is thus achieved. This optimum restore is achieved without increasing the time that signal *RAS must be active. The minimum time period that signal *RAS must be active is also known as the minimum active cycle time. The active cycle time is thus not affected by this refresh scheme. Additionally, there is no dependence upon signal *CAS for achieving this restore. The gains of coupling transistors 36 and 37 also need not be reduced in order to reduce the loading effect on the bit lines. The gains of coupling transitors 36–39 can be chosen so that speed need not be sacrificed in order to obtain adequate restore of the memory cells.

Figure 3:
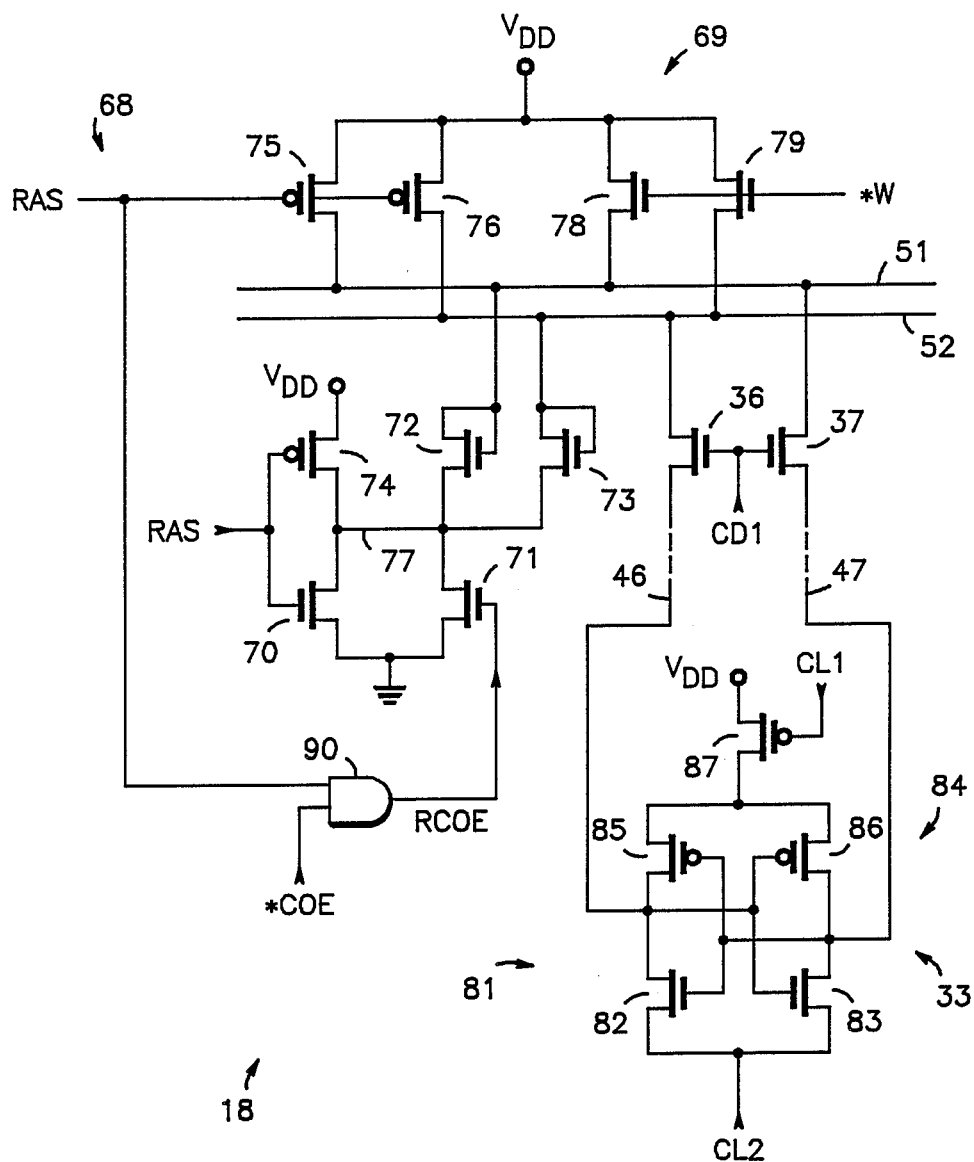
FIG. 3 is a circuit diagram of a circuit for biasing data lines of the memory of FIG. 1 according to a preferred embodiment of the invention.

Shown in FIG. 3 is a circuit diagram of bias crcuit 18. circuit 18 is comprised of the first section, a section 68, and the second section, section 69. The first section is comprised of N channel transistors 70, 71, 72, and 73 and P channel transistors 74, 75, and 76. Transistor 70 has a gate for receiving signal RAS, a source connected to ground, and a drain connected to a node 71. Transistor 74 has a gate for receiving signal RAS, a source connected to VDD, and a drain connected to node 77. Transistor 71 has a gate for receiving signal *COE, a source connected to ground, and a drain connected to node 77. Transistor 72 has a source connected to node 77, and a gate and a drain connected to data ine 51. Transistor 73 has a source connected to node 77, and a gate and a drain connected to data line 52. Transistor 75 has a gate for receiving signal RAS, a drain connected to data line 51, and a source connected to VDD. Transistor 76 has a gate for receiving signal RAS, a drain connected to data line 52, and a source connected to VDD. Second section 69 is comprised of N channel transistors 78 and 79. Transistor 78 has a gate for receiving signal *W, a drain connected to VDD, and a source connected to data line 51. Transistor 79 has a gate for receiving signal *W, a drain connected to VDD, and a source connected to data line 52. Bias circuit 18 further comprises a NAND gate 90 which has a first input for receiving a signal RAS, which is generated complementary to signal *RAS, and a second input for receiving signal *COE, and an output for providing a signal RCOE. Also shown in FIG. 3 are coupling transistors 36 and 37, bit lines 46 and 47, and sense amplifier 33. Sense amplifier 33 comprises an N channel amplifier 81 comprised of N channel transistors 82 and 83, a P channel amplifier 84 comprised of P channel transistors 85 and 86, and a P channel clocking transistor 87. The configuration of sense amplifier 33 having a cross-coupled N channel amplifier in parallel with a cross-coupled P channel amplifier is conventional for CMOS sense amplifiers. Sense amplifier 33 is shown as being clocked by signals CL1 and CL2 from clock circuit 21. Coupling transistors 36 and 37 are shown as being clocked by a column decoder signal CD1 from column decoder 14.

When signal RAS is inactive at a logic low to indicate that memory 10 is in the inactive cycle, transistors 75 and 76 precharge data lines 51 and 52 to VDD, and transistor 74 precharges node 77 to VDD. Transistor 70 is not conducting when signal RAS is inactive. During the active cycle, signal RAS becomes active at a logic low in response to signal *RAS switching to a logic low. Transistors 74, 75, and 76 become non-conductive while transistor 70 becomes conductive. Signal RCOE switches to a logic high in response to signal *RAS becoming active. While signal RCOE is a logic high transistor 71 is conductive. Transistors 78 and 79 are conductive whenever memory 10 is in the read mode which is indicated by signal *W being a logic high. Transistor 71 is chosen to be of relatively high gain in relation to that of transistors 72 and 73. Transistor 71 thus pulls node 77 to very near ground. Data lines 51 and 52 begin being discharged from VDD toward the predetermined bias potential of a few tenths of a volt above ½ VDD. The predetermined bias potential is obtained by selecting the gains of transistors 78, 79, 72, 73, and 71. Transistors 78 and 72 form a resistor divider for setting the bias potential on data line 51. Transistors 79 and 73 form a resistor divider for setting the bias potential on data line 52. The desired bias potential is thus obtained by choosing the ratio of the gain of transistor 78 to transistor 72 and the gain of transistor 79 to transistor 73. The rate of discharge is primarily related to the gain of transistors 72 and 73 and the capacitance of data lines 51 and 52. Data lines 51 and 52 are quite long and thus highly capacitive. Transistors 72 and 73 to have a gain such that data lines 51 and 52 would be discharged to the desired bias level of a few tenths of a volt over ½ VDD before the time signal *COE switches to a logic low. Signal *COE switches to a logic low a predetermined time following signal *RAS switching to a logic low. Signal *COE switches to a logic low to cause column decoder 14 to cause a pair of bit lines to be coupled to data lines 51 and 52. Bias circuit 18 should release control of data lines 51 and 52 before the selected bit lines are connected thereto. Signal RCOE is conveniently generated for this purpose. Using signal RCOE provides for disabling second section 68 of bias circuit 18 just before data is coupled to the bit lines. This has the advantage of not releasing control of data lines 51 and 52 too soon so as to minimize the time available for data lines 51 and 52 to drift from the desired bias. Transistor 70 remains conductive throughout the active cycle to keep node 77 from drifting to some undesirable voltage. In CMOS it is particularly desirable to keep nodes from floating due to possible latch-up problems.

When a bit line pair such as bit lines 46 and 47 are coupled to data lines 51 and 52, data developed by sense amplifier 33 begins separating data lines 51 and 52. N channel transistors 82 and 83 have the most effect in the early stages of amplification so that the tendency is for the data lines to become biased at a reduced voltage. Transistors 78 and 79 are left conductive to match the current pull of N channel transistors 82 and 83. This results in the separation of data lines 51 and 52 being centered near the desired bias voltage. The rate of separation is not significantly effected by keeping transistors 78 and 79 conductive but the center point of the separation is. This results in keeping amplifier 19 in the high gain bias range.

The voltage range which will provide much of the desired advantage is fairly wide. The main desire is for the bias voltage to be in the maximum gain region of the secondary amplifier, amplifier 19, which is in the range of 30% to 70% of VDD. Another approach would be much the same as that used for equalizing the bit lines. Data lines 51 and 52 could be fully separated between VDD and ground, then equalized to about ½ VDD, and then released just before the pair of bit lines are coupled thereto. Circuit 18 does not need any additional timing signals to those already required in operation of memory 10. Additionally, circuit 18 provides for a better opportunity to match the bias voltage on the bit lines.

After a memory cell in a conventional NMOS DRAM has been accessed and corresponding data has been output, the DRAM goes into an inactive cycle during which precharge of the bit lines normally occurs. This inactive cycle has also come to be known as the precharge cycle. With precharge occurring in the inactive cycle, whatever refreshing that was to be done had to be done in the active portion of the cycle. Consequently, refresh was part of the time required for the active cycle. In a CMOS DRAM, such as memory 10 of FIG. 1, the bit lines are equalized at an intermediate voltage at the beginning of the active cycle so that the precharge function is no longer in the inactive cycle. The inactive cycle is so short that it is in fact virtually irrelevant. Consequently, the short amount of time added to the inactive cycle to complete the restore is not significant to a user.

We claim:
1. A dynamic random access memory, comprising:
a plurality of bit lines;
a plurality of word lines intersecting the plurality of bit lines;
a plurality of refreshable memory cells located at respective intersections of the bit lines and the word lines, each memory cell providing a signal to its respective bit line indicative of data stored therein in response to its respective word line being enabled;
address input means for sequentially receiving a row address then a column address, providing said row address as an output in response to a first externally generated clock signal being active, and providing said column address as an output after providing said row address;
row decoder means for enabling a selected word line in response to receiving the row address from the address input means;
a plurality of sense amplifiers, coupled to respective bit lines, each for amplifying the signal on the respective bit line provided by the memory cell cou- pled to the respective bit line and the enabled word line;

column decoder means for coupling a selected bit line to a common data line in response to receiving the column address signal from the address input means and for decoupling the selected bit line from the common data line in response to a second externally generated clock signal becoming inactive;

a secondary sense amplifier, coupled to the common data line, for amplifying the signal coupled to the common data line from the selected bit line, and for providing an output indicative thereof;

output means for coupling the output of the secondary sense amplifier to an output of the memory in response to the second externally generated clock signal being active; and restore means for holding the selected word line in the enabled state a predetermined time delay following the second externally generated clock signal becoming inactive;

whereby the memory cell coupled to the selected bit line is fully refreshed in response to the second externally generated clock signal being inactive.

2. The memory of claim 1 further comprising:

bit line precharge means for setting the bit lines to a predetermined voltage in response to the first externally generated clock signal being active.

3. The memory of claim 2 wherein the secondary amplifier is characterized as being coupled to first and second power supply terminals for receiving a power supply voltage.

4. The memory of claim 3 further comprising bias means for biasing the data lines to a voltage intermediate the voltage supplied between the first and second power supply terminals prior to the column decoder means coupling the selected bit line to the common data line.

5. The memory of claim 4 wherein the bias means is further characterized as biasing the data lines to a voltage between 30 percent and 70 percent of the power supply voltage.

6. In a memory having a plurality of bit lines; a plurality of word lines intersecting the plurality of bit lines; a plurality of refreshable memory cells coupled to respective bit lines and word lines at intersections thereof, each memory cell providing a signal indicative of data stored therein to the bit line to which it is coupled in response to the word line to which it is coupled being enabled; a plurality of sense amplifiers, coupled to respective bit lines, each for amplifying the signal provided by the memory cell coupled to the respective bit line; and a secondary amplifier coupled to a data line for amplifying a signal coupled thereto, a method for restoring data in the memory cells, comprising:

enabling a selected word line so that bit lines develop signals indicative of data stored in memory cells coupled to the enabled word line;

coupling a selected bit line to the data line so that the signal present on the selected bit line is coupled to the data line;

detecting the signal coupled to the data line using the secondary amplifier;

decoupling the selected bit line from the data line after detecting the signal present on the selected bit line; and disabling the selected word line a predetermined time after the selected bit line has been decoupled from the data line.

7. The method of claim 6 further comprising the steps of:

applying a power supply voltage to the secondary amplifier; and biasing the data line to a voltage intermediate the power supply voltage applied to the secondary amplifier.

8. The method of claim 6 further comprising the steps of:

applying a power supply voltage to the secondary amplifier; and biasing the data line to a voltage between 30 percent and 70 percent of the power supply voltage applied to the secondary amplifier.

9. A dynamic random access memory, comprising:

a plurality of bit lines;

a plurality of word lines intersecting the plurality of bit lines;

a plurality of refreshable memory cells located at respective intersections of the bit lines and the word lines, each memory cell providing a signal to its respective bit line indicative of data stored therein in response to its respective word line being enabled;

row decoder means for enabling a selected word line in response to receiving a row address and for disabling all of the word lines in response to receiving a row disable signal;

a plurality of sense amplifiers, coupled to respective bit lines, each for amplifying the signal on the respective bit line provided by the memory cell coupled to the respective bit line and the enabled word line;

column decoder means for coupling a selected bit line to a common data line in response to receiving a column address and for decoupling the selected bit line from the common data line in response to a clock signal;

a secondary sense amplifier, coupled to the common data line, for amplifying the signal coupled to the common data line from the selected bit line; and clock means for generating, in response to the clock signal, the row disable signal a predetermined time duration after the column decoder means has decoupled the selected bit line from the common data line.

10. The memory of claim 9 further comprising:

bit line precharge means for setting the bit lines to a predetermined voltage in response to the first externally generated clock signal being active.

11. The memory of claim 9 wherein the secondary amplifier is characterized as being coupled to first and second power supply terminals for receiving a power supply voltage.

12. The memory of claim 11 further comprising bias means for biasing the data lines to a voltage intermediate the voltage supplied between the first and second power supply terminals prior to the column decoder means coupling the selected bit line to the common data line.

13. The memory of claim 12 wherein the bias means is further characterized as biasing the data lines to a voltage between 30 percent and 70 percent of the power supply voltage.

* * * * *